United States Patent
Ruan et al.

(10) Patent No.: US 10,882,304 B2
(45) Date of Patent: Jan. 5, 2021

(54) SCREEN PRINTING METHOD AND IMPRINTING APPARATUS

(71) Applicants: BOE TECHNOLOGY GROUP CO., LTD., Beijing (CN); ORDOS YUANSHENG OPTOELECTRONICS CO., LTD., Inner Mongolia (CN)

(72) Inventors: Shixin Ruan, Beijing (CN); Fuyi Cui, Beijing (CN); Xuefei Bai, Beijing (CN); Fashun Li, Beijing (CN); Chunsheng Gu, Beijing (CN); Xuwei Li, Beijing (CN)

(73) Assignees: BOE TECHNOLOGY GROUP CO., LTD., Beijing (CN); ORDOS YUANSHENG OPTOELECTRONICS CO., LTD., Inner Mongolia (CN)

( * ) Notice: Subject to any disclaimer, the term of this patent is extended or adjusted under 35 U.S.C. 154(b) by 377 days.

(21) Appl. No.: 15/537,939

(22) PCT Filed: Jan. 23, 2017

(86) PCT No.: PCT/CN2017/072247
§ 371 (c)(1),
(2) Date: Jun. 20, 2017

(87) PCT Pub. No.: WO2017/197922
PCT Pub. Date: Nov. 23, 2017

(65) Prior Publication Data
US 2018/0207927 A1 Jul. 26, 2018

(30) Foreign Application Priority Data
May 18, 2016 (CN) .......................... 2016 1 0331756

(51) Int. Cl.
| | | |
|---|---|---|
| *B41F 15/34* | (2006.01) | |
| *B41F 15/08* | (2006.01) | |
| *B41F 15/46* | (2006.01) | |
| *B41F 15/44* | (2006.01) | |
| *H05K 3/12* | (2006.01) | |

(52) U.S. Cl.
CPC .......... *B41F 15/34* (2013.01); *B41F 15/0818* (2013.01); *B41F 15/0881* (2013.01);
(Continued)

(58) Field of Classification Search
CPC ............ B41F 15/08181; B41F 15/0881; B41F 15/34; B41F 15/44; B41F 15/46; H01K 3/1233; H01L 27/32; H01L 51/56
See application file for complete search history.

(56) References Cited

U.S. PATENT DOCUMENTS

| | | |
|---|---|---|
| 4,893,556 A | 1/1990 | Takahashi et al. |
| 5,052,291 A | 10/1991 | Takahashi et al. |

(Continued)

FOREIGN PATENT DOCUMENTS

| | | |
|---|---|---|
| CN | 101823360 A | 9/2010 |
| CN | 102632703 A | 8/2012 |

(Continued)

OTHER PUBLICATIONS

Search Report from European Patent Application No. 17728997.2 dated Aug. 18, 2017.
(Continued)

*Primary Examiner* — Matthew G Marini
*Assistant Examiner* — Marissa Ferguson-Samreth
(74) *Attorney, Agent, or Firm* — Calfee, Halter & Griswold LLP

(57) ABSTRACT

A printing screen method includes: providing at least one printing scraper assembly, wherein the printing scraper assembly has a printing scraper and a pressure sensing feedback system; placing at least one printing screen on a
(Continued)

substrate; detecting and supplying a pressure value between the printing scraper and the printing screen during printing by the pressure sensing feedback system; and comparing the supplied pressure value and a predetermined pressure value, and changing the pressure between the printing scraper and the printing screen if a difference between the feedback pressure value and the predetermined pressure value is larger than a predetermined threshold. An imprinting apparatus implementing the printing screen method is also provided.

12 Claims, 1 Drawing Sheet

(52) U.S. Cl.
CPC .............. *B41F 15/44* (2013.01); *B41F 15/46* (2013.01); *H05K 3/1233* (2013.01)

(56) References Cited

U.S. PATENT DOCUMENTS

| | | | |
|---|---|---|---|
| 7,614,341 B1 | 11/2009 | Pai et al. | |
| 2009/0158943 A1 | 6/2009 | Kobayashi | |

FOREIGN PATENT DOCUMENTS

| | | | | |
|---|---|---|---|---|
| CN | 202965451 U | 6/2013 | | |
| CN | 203157330 U | 8/2013 | | |
| CN | 104325778 A | 2/2015 | | |
| CN | 204296183 U | 4/2015 | | |
| CN | 104608513 A | 5/2015 | | |
| CN | 106004136 A | 10/2016 | | |
| DE | 3805363 A1 | 9/1988 | | |
| EP | 0408393 A2 | 1/1991 | | |
| GB | 2202795 A | 10/1988 | | |
| JP | 02-310988 | * 12/1990 | .............. | H05K 3/12 |
| JP | 04-44848 | * 2/1992 | .............. | B41F 15/08 |
| JP | 2007253593 A | 10/2007 | | |
| JP | 2015044337 A | 3/2015 | | |
| KR | 20150094397 A | 8/2015 | | |

OTHER PUBLICATIONS

First Office Action for Chinese Patent Application No. 201610331756.3 dated Oct. 25, 2017.

Search Report for International Application No. PCT/CN2017/072247 dated Mar. 29, 2017.

\* cited by examiner

SCREEN PRINTING METHOD AND IMPRINTING APPARATUS

CROSS-REFERENCE TO RELATED APPLICATIONS

The present application is based upon International Application No. PCT/CN2017/072247, filed on Jan. 23, 2017, which is based upon and claims priority to Chinese Patent Application No. 201610331756.3, filed May 18, 2016, the entire contents of which are incorporated herein by reference as a part of the present application.

TECHNICAL FIELD

The present disclosure relates to the field of screen printing technology, and more particularly, to a screen printing method and an imprinting apparatus.

BACKGROUND

In a production process of an OLED screen (organic light-emitting diode), it is required to coat multiple layers of materials on a substrate (back cover glass). In a process of forming a mask layer, a desired printed pattern is formed by screen printing.

SUMMARY

An objective of the present disclosure is to provide a screen printing method and an imprinting apparatus.

A screen printing method is provided, including:

providing at least one printing scraper assembly, wherein the printing scraper assembly has a printing scraper and a pressure sensing feedback system;

placing at least one printing screen on a substrate;

detecting and supplying a pressure value between the printing scraper and the printing screen during printing by the pressure sensing feedback system; and comparing the supplied pressure value and a predetermined pressure value, and changing a pressure between the printing scraper and the printing screen when a difference between the supplied pressure value and the predetermined pressure value is larger than a predetermined threshold.

An imprinting apparatus is also provided by the present disclosure, including a printing beam, a platform, a control device and at least one printing scraper assembly, wherein the printing scraper assembly is movably mounted on the printing beam, and the printing scraper assembly has a printing scraper and a pressure sensing feedback system, wherein the pressure sensing feedback system is configured to supply a pressure value between the printing scraper and a printing screen during printing; and the control device is configured to compare the feedback pressure value and a predetermined pressure value, and to change the pressure between the printing scraper and the printing screen when a difference between the feedback pressure value and the predetermined pressure value is larger than a predetermined threshold.

It is to be understood that both the foregoing general description and the following detailed description are exemplary and explanatory only and are not restrictive of the disclosure, as claimed.

This section provides a summary of various implementations or examples of the technology described in the disclosure, and is not a comprehensive disclosure of the full scope or all features of the disclosed technology.

BRIEF DESCRIPTION OF THE DRAWINGS

In order to more clearly illustrate the technical solution of the embodiments of the present disclosure, the drawings of the embodiments will be briefly described below, and it should be understood that the drawings described below only relate to some embodiments of the present disclosure, rather than limit the present disclosure, wherein.

DETAILED DESCRIPTION

Figure 1:
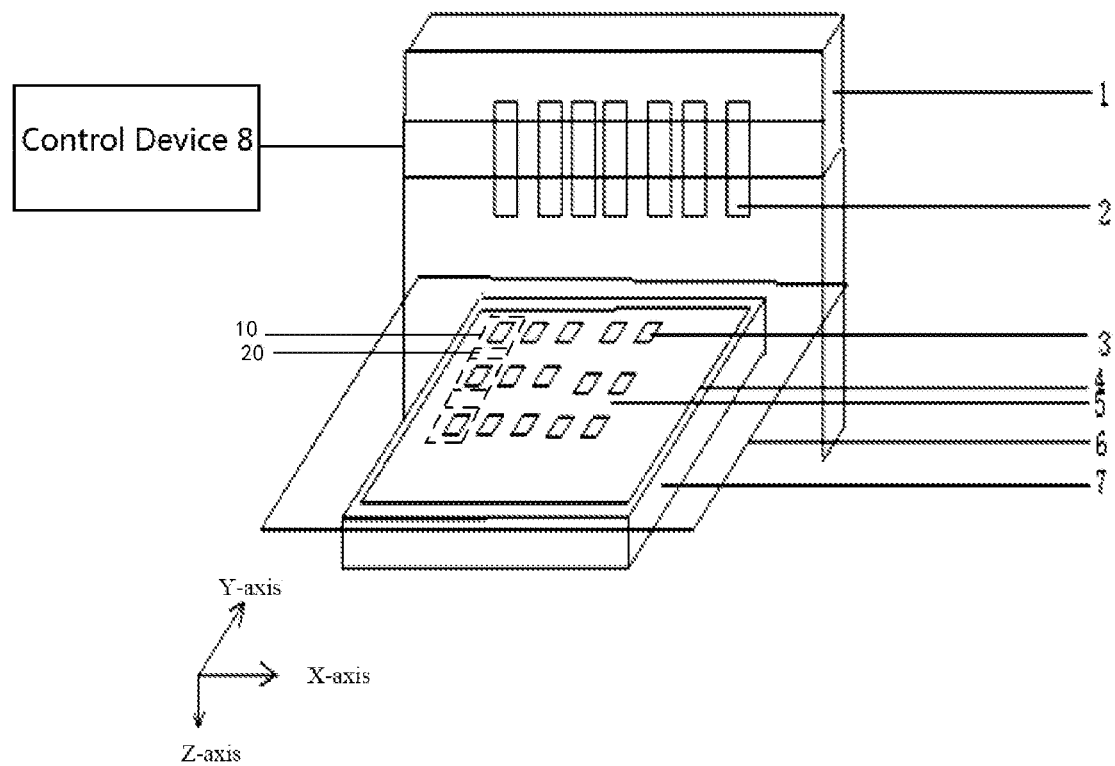
FIG. 1 is a schematic perspective view of an imprinting apparatus provided by an embodiment of the present disclosure.

In order to make the objective, technical solutions and advantages of the embodiments of the present disclosure to be more apparent, the technical solutions in the embodiments of the present disclosure will be clearly and thoroughly described in combination with the drawings. Apparently, the described embodiments are merely part of the embodiments and not all of the embodiments of the present disclosure. Based on the embodiments of the present disclosure, all other embodiments obtained by those of ordinary skill in the art without making creative effort are within the scope of the present disclosure.

When referring to the elements of the present disclosure and the embodiments thereof, the articles "a", "a", "the" and "the said" are intended to mean the presence of one or more elements. The terms "include (including)", "comprise (comprising)", "contain (containing)" and "have (having)" are intended to be inclusive and to indicate that there may be additional elements other than the listed elements. For the purpose of the description below, as the indicated direction shown in the drawings, the terms "up", "down", "left", "right", "vertical", "horizontal", "top", "bottom" and their derivatives are involved in the present disclosure. The terms "overriding", "on top of", "positioned over" or "positioned on top of" means that a first element such as a first structure exists on a second element such as a second structure. However, there may be an intermediate element such as an interface structure between the first element and the second element. The term "contact" means connecting a first element such as a first structure and a second element such as a second structure, and at the interface of the two elements there may be other elements or may be no other elements.

In preparation of a printing operation, when a printed metal screen is placed horizontally, due to action of gravity, deformation is formed at a middle portion of the printed metal screen. If approaching to the middle portion, the deformation becomes severer. In the related art, when a straight-sided printing scraper is employed, a force applied on the deformed portion at middle of the printed metal screen is different from a force applied on either side of the printed metal screen by the printing scraper. Moreover, during a printing process, due to the existence of the pressure, the deformed screen will be deformed toward a finishing position under the action of the scraper. In addition, the deformation of the printing screen due to the gravity will be stretched toward the finishing position under the pressure of the scraper, resulting in the printed product has excessive printing offsets in the starting region and the finishing region.

When the printing offset occurs, the accuracy of alignment of the corresponding effective light-emitting area will be reduced after subsequent bonding is completed. If the printing offset is excessively large, the effect of the subsequent laser sintering will be reduced, which cannot satisfy the process requirement. Moreover, the popular narrow-bezel products in the market have high requirements on the accuracy of the printing offset. The increase in offset will lead to a low yield of narrow-bezel products.

Hereinafter, specific embodiments of the screen printing method and the imprinting apparatus provided in the present embodiment of the present disclosure will be described in detail with reference to the accompanying drawings.

In the drawings, the thickness and the shape of the various components do not reflect the actual proportions of the various components and only schematically illustrate the contents of the present disclosure.

FIG. 1 is a schematic perspective view of an imprinting apparatus provided by an embodiment of the present disclosure. In FIG. 1, "1" denotes a printing beam. "2" denotes a plurality of scraper assemblies with pressure sensing feedback systems. "3" denotes a plurality of screens on a substrate. "4" denotes the substrate. "5" denotes a gap between the screens 3 on the substrate. "6" denotes a printing screen. "7" denotes a platform. "8" denotes a control device (not shown in the figure).

Firstly, the substrate 4 (back plate glass) is placed on the platform 7. Then the printing screen 6 is placed on the substrate 4 with a certain gap between the printing screen 6 and the substrate 4. A printing material is coated on a mesh of the screen. The scraper assemblies 2 press their scrapers against the mesh of the printing screen 6 at a predetermined pressure, and move their scrapers to press and generate a desired printing pattern on the substrate 4. The control device 8 is located on the imprinting apparatus. It will be understood by those skilled in the art that the control device 8 is connected to the imprinting apparatus in a wired or wireless manner.

In order to improve the processing efficiency, the substrate 4 may be divided into regions in which a plurality of screens 3 are disposed. For example, as shown in FIG. 1, the substrate 4 includes printing regions 10 corresponding to the screens 3 and a non-printing region 20 located between the printing regions 10 in each column and corresponding to the gap between the screens 3 in the column. As shown in FIG. 1, the number of screens 3 in each row on the substrate 4 is 5. However, the above number is only for illustration. One skilled in the art will appreciate that the number of screens 3 in each row on the substrate may be more or less. The number of scrapers 2 having pressure sensing feedback systems on the printing beam 1 is larger than the number of the screens 3 in each row along a X-axis direction on the substrate, to ensure that there are scrapers serving as replacement parts. During a processing, the printing beam 1 moves along a Y-axis direction, and each scraper assembly 2 causes a scraper to respectively act on a corresponding screen 3 at a predetermined pressure, to thereby completing the imprinting in batches.

The printing screen 6 is generally made of a metal. After the printing screen 6 is placed on the substrate 4, the printing screen 6 is deformed under its own gravity in both of the Y-axis direction and the X-axis, and the closer a portion is from the middle portion, the severer the deformation becomes. In this case, if the scraper assemblies 2 press the printing screen 6 with the same force, in a region where relatively large deformation is generated, there is a deviation between the pressure actually applied by the scraper on the printing screen and a predetermined pressure, resulting an offset of the printing pattern.

According to the embodiments of the present disclosure, when the printing operation is started, each of the pressure sensing feedback systems supplies an actual pressure value P between a corresponding scraper and the printing screen 6 to the control device 8. The control device 8 compares the actual pressure value P and a predetermined pressure value P0. If a difference between them is larger than a predetermined threshold T, a pressure value outputted by the scraper assembly 2 having the printing scraper is adjusted, such that the actual pressure value P between the scraper and the printing screen 6 is more approximate to the predetermined pressure value P0. The predetermined pressure value P0 and the threshold T may be set according to specific process requirements.

In this way, it is possible to change the position of the printing scraper relative to the printing screen in accordance with the pressure sensing feedback data during the printing process so as to satisfy the predetermined pressure parameters input by the apparatus at different positions of the printing screen, and to compensate the deformation of the metal printing screen, which is generated due to the gravity, thereby reducing the offset of the finished product after the printing is completed.

According to the above embodiments, each of the plurality of printing scrapers applies a force on one screen 3 respectively. It will be appreciated by those skilled in the art that the plurality of scraper assemblies 2 may be movably mounted on the printing beam 1. When a width of the screen 3 is greater than a width of a single printing scraper, a plurality of printing scrapers may be combined to form one or a plurality of integral scrapers, with each of the integral scrapers having a width larger than the width of a single screen 3, such that the printing scrapers act on the entire printing region to form desired printing patterns. Moreover, it is possible to combine all of the printing scraper assemblies 2 on the printing beam 1 to form a conventional linear-type integral scraper. In this way, in the printing operation process, according to the number and the width of objects to be processed, the printing scrapers may be combined to form an integral scraper of a corresponding number and width. Compared with the conventional straight-sided integral scraper, the combinable separated scrapers provided by the present disclosure have a broader application range, and the effect of the printing products is more accurate and the yield is higher.

Figure 2:
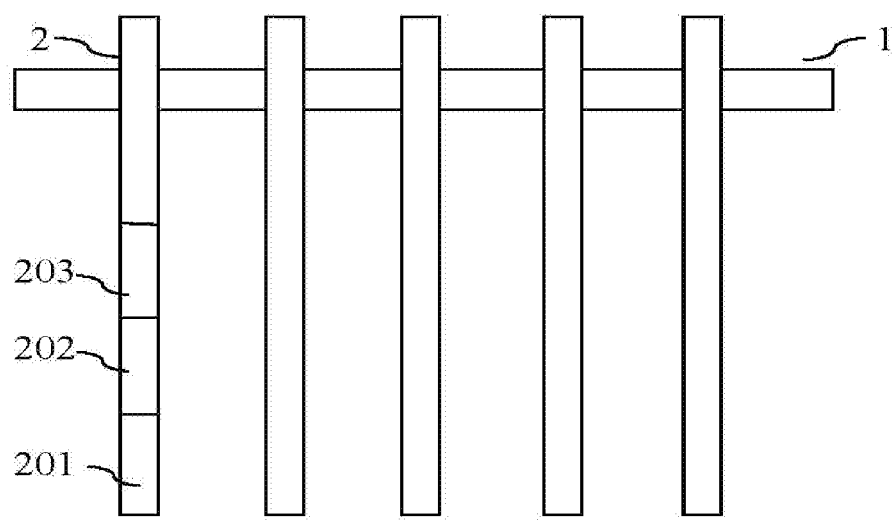
FIG. 2 is a longitudinal schematic view of a scraper assembly of an imprinting apparatus provided by an embodiment of the present disclosure.

FIG. 2 is a longitudinal schematic view of a scraper assembly 201 of an imprinting apparatus provided by an embodiment of the present disclosure. In FIG. 2, "1" denotes a printing beam. "2" denotes a scraper assembly. "201" denotes a scraper. "202" denotes a pressure sensing feedback system. "203" denotes a scraper driving device.

The control device 8 may move the scraper assembly 2 on the printing beam 1 along the X-axis direction as shown in FIG. 1, and move the scraper according to the pressure sensing feedback data in a Z-axis direction (a direction perpendicular to the plane where the printing screen is located).

According to an exemplary embodiment of the present disclosure, before start of the printing operation, preparation is required. According to process requirement, a predetermined pressure value is input to the control device. If the force between the printing scraper and the printing screen is more approximate to the predetermined pressure value, the effect of the printing product is better. Optionally, a predetermined threshold is also input to the control device 8. When a difference between an actual pressure data fed back by the pressure sensing feedback system 202 and the predetermined pressure value is less than the predetermined threshold, the deviation/error of the printing product is in an acceptable range, and thus there is no need to move the printing scraper.

After the preparation, a material to be printed is covered in an effective printing region of the printing screen by using a material scraper, to complete the printing of the material scraping and covering. Then, the distances between the scraper assemblies 2 are adjusted according to the distances between the plurality of screens 3 on the substrate, such that the scrapers 201 of the scraper assemblies 2 are respectively aligned with the screens 3. The width of the scraper 201 is not less than the width of the screen 3 in the X-axis direction, which can ensure that the screen 3 is sufficiently suffered from the force of the scraper 201.

After the printing operation starts, the control device 8 makes the printing scraper 201 of the scraper assembly 2 to press against on the printing screen 6 at a predetermined pressure value P0 according to an input predetermined pressure value, such that a pressure is generated against the mesh on the printing screen 6. With the movement of the printing beam 1 along the Y-axis, the printing material is covered and scraped on the screen 3. During the printing process, the pressure sensing feedback system 202 supplies an actual pressure value between the scraper 201 and the printing screen 6 to the control device 8 at a predetermined time interval. The control device 8 compares an actual pressure value P with the predetermined pressure value P0, and if a difference T between them is not larger than a predetermined threshold T0, the printing operation is continued. If the difference T between them is larger than the predetermined threshold T0, the pressure value is adjusted, such that the actual value P between the scraper 201 and the printing screen 6 is more approximate to the predetermined pressure value P0.

According to an exemplary embodiment, through the scraper driving device 203 provided on the scraper assembly 2, the scraper 201 is caused to move along the Z-axis and/or X-axis, to change the actual pressure value P. For example, the actual pressure value P between the scraper 201 and the printing screen 6 is larger than the predetermined pressure value P0, the control device 8 sends a control signal to the scraper driving device 203. The scraper driving device 203 causes the scraper 201 to move along the Z-axis, to reduce the actual pressure value P.

When the scraper assembly 2 passes through the gap between the screens 3 on the substrate 4, the control device 8 may reduce the actual pressure value applied on the printing screen by the scraper 201, such that the scraper 201 does not generate a pressure on the gap 5, which may reduce the stretching deformation of the printing screen 6 due to the scraping action of the pressure. Subsequently, when the scraper assembly 2 passes through the next screen 3, the control device 8 increases the pressure data to be input to the scraper assembly 2, and the scraper assembly 2 can continue the printing operation. The above action is repeated to complete the printing operation of the whole substrate 4.

The gap 5 between the screens 3 of the printing screen 6 is not an effective printing region. That is, when the scraper assembly 2 passes through each gap 5, there is no an actual printing operation, however, the printing screen 6 may be further deformed. According to this exemplary embodiment, when the scraper assembly 2 passes through each gap 5, the control device 8 causes the scraper assembly 2 to reduce the outputted printing pressure. In this way, the deformation due to the pressing and stretching on the printing screen 6 during the printing operation may be mitigated. Thereby, the printing accuracy of the final printing product may be improved and the life of the metallic printing screen may be extended.

According to an exemplary embodiment, the screen printing performed by the imprinting apparatus according to the present disclosure includes the following steps.

A predetermined pressure parameter and a predetermined threshold are input to the control device 8. In case that the printing screen 6 is not deformed, the printing scraper 201 acts uniformly on the region to be printed (such as the screen 3) on the printing screen 6 at a predetermined pressure value P0 which corresponds to the input pressure parameter.

The position of the scraper assembly 2 on the printing beam 1 along the X-axis direction is adjusted, such that each scraper assembly 2 aligns with the corresponding screen 3.

The printing material is covered on the full effective printing region of the printing screen 6 by using the material scraper.

The printing scraper 201 on the printing scraper assembly 2 presses against the printing region (such as the screen 3) of the printing screen 6 with a predetermined pressure value P.

By using the pressure sensing feedback system 202 on the printing scraper assembly 2, the actual pressure value applied on the printing screen 6 by the printing scraper 201 is measured.

The control device 8 compares the actual pressure value P fed back by the pressure sensing feedback system 202 with the predetermined pressure value P0.

When a difference T between the actual pressure value P and the predetermined pressure value P0 is not larger than the predetermined threshold T0, it is considered that the deformation of this portion of region of the printing screen, which is currently measured, is within an acceptable range, and the printing beam 1 is moved along the Y-axis direction to continue the printing operation.

When the difference T between the actual pressure value P and the predetermined pressure value P0 is larger than the predetermined threshold T0, it is considered that the deformation of this portion of region of the printing screen, which is currently measured, exceeds the acceptable range, and the actual pressure value P applied on the printing screen 6 by the printing scraper 2 is changed according to the actual pressure value P which is fed back, wherein the printing scraper assembly 2 is moved along the X-axis direction or the Y-axis direction, to change the position of the printing scraper 201 relative to the printing screen 6, and thus to change the actual pressure value P.

When the printing scraper assembly 2 passes through the gap 5 on the printing screen 6, the control device 8 causes the printing scraper assembly 2 to reduce the outputted pressure value, to reduce the further deformation of the printing screen 6 caused by the pressure.

The above steps are repeated until printing of all the regions to be printed is completed.

The printing screen 6 is removed to form a printing pattern on the substrate 4.

With the printing scraper assembly 2 having the pressure sensing feedback system according to the embodiments of the present disclosure, the error in the X-axis direction caused by the deformation of the printing screen 6 generated due to gravity may be corrected, to make the pressure applied on the printing screen 6 by the printing scraper 201 more approximate to the pressure parameter input by the apparatus, such that all the portions of the printing screen 6 receive substantially the same force during the process. Optionally, it may also be possible to perform an adjustment in the Y-axis direction according to the pressure sensing feedback system 202 during the printing operation, such that pressure on each portion of the printing screen 6 is more approximate to the predetermined pressure value which is inputted.

Compared with the straight-sided printing scraper in the related art, the printing scraper according to the present disclosure can reduce the offset of the finished product after the printing is completed, to ensure that the accuracy of the subsequent alignment and bonding of the product. During the subsequent laser sintering process, sintering defects caused by the offset may be reduced. Subsequently, the difficulty in cutting may also be reduced, and thus, the yield of the narrow-bezel products in the above process may be improved.

Apparently, those skilled in the art may make various modifications and alterations to the present disclosure without departing from the spirit and scope of the present disclosure. If such modifications and alterations to the present disclosure belong to the scope of the claims of the present disclosure and their equivalents, the present disclosure is also intended to cover such modifications and alterations.

What is claimed is:

1. A screen printing method, comprising:
   providing at least one printing scraper assembly, wherein the printing scraper assembly comprises a printing scraper and a pressure sensing feedback system;
   placing at least one printing screen on a substrate;
   detecting, by the pressure sensing feedback system, a pressure value between the printing scraper and the printing screen during printing, and supplying, by the pressure sensing feedback system, the detected pressure value to a control device; and
   comparing, by the control device, the supplied pressure value and a predetermined pressure value, and changing, by the control device, a pressure between the printing scraper and the printing screen if a difference between the supplied pressure value and the predetermined pressure value is larger than a predetermined threshold,
   wherein the substrate comprises first and second printing regions and a non-printing region between the first and second printing regions,
   wherein the method further comprises during the printing:
   moving, by the control device, the printing scraper on the printing screen to pass through the first printing region, the non-printing region and the second printing region successively,
   wherein the printing scraper, when passing through the non-printing region, is controlled by the control device to be moved away from the printing screen in a first direction perpendicular to a plane where the printing screen is located so that the pressure between the printing scraper and the printing screen in the non-printing region is smaller than that between the printing scraper and the printing screen in the first and second printing regions,
   wherein the at least one printing scraper assembly comprises a plurality of printing scraper assemblies, and the pressures between at least two printing scrapers of the plurality of printing scraper assemblies and the printing screens are different in different regions.

2. The screen printing method according to claim 1, wherein the printing scraper is moved along the first direction perpendicular to the plane where the printing screen is located by using a scraper driving device, to change the pressure between the printing scraper and the printing screen.

3. The screen printing method according to claim 2, wherein the printing scraper is moved along a second direction parallel to a lengthwise direction of a printing beam by using the scraper driving device, to further change the pressure between the printing scraper and the printing screen.

4. The screen printing method according to claim 3, wherein the printing scraper assembly is movably mounted on the printing beam, and at least two printing scraper assemblies are combined together to form an integral scraper.

5. The screen printing method according to claim 1, wherein the printing scraper assembly is movably mounted on a printing beam, and at least two printing scraper assemblies are combined together to form an integral scraper.

6. The screen printing method according to claim 2, wherein the printing scraper assembly is movably mounted on a printing beam, and at least two printing scraper assemblies are combined together to form an integral scraper.

7. An imprinting apparatus, comprising a printing beam, a platform, a control device and at least one printing scraper assembly, wherein the printing scraper assembly is movably mounted on the printing beam, and the printing scraper assembly has a printing scraper and a pressure sensing feedback system, wherein
   the pressure sensing feedback system is configured to sense a pressure value between the printing scraper and a printing screen on a substrate during printing; and
   the control device is configured to compare the sensed pressure value and a predetermined pressure value, and to change the pressure between the printing scraper and the printing screen when a difference between the sensed pressure value and the predetermined pressure value is larger than a predetermined threshold,
   wherein the substrate comprises first and second printing regions and a non-printing region between the first and second printing regions,
   wherein the control device is configured to during the printing:
   move the printing scraper on the printing screen to pass through the first printing region, the non-printing region and the second printing region successively,
   wherein the printing scraper, when passing through the non-printing region, is moved away from the printing screen in a first direction perpendicular to a plane where the printing screen is located so that the pressure between the printing scraper and the printing screen in the non-printing region is smaller than that between the printing scraper and the printing screen in the first and second printing regions,
   wherein the at least one printing scraper assembly comprises a plurality of printing scraper assemblies, and the pressures between at least two printing scrapers of the plurality of printing scraper assemblies and the printing screens are different in different regions.

8. The imprinting apparatus according to claim 7, wherein the printing scraper assembly has a scraper driving device configured to cause the printing scraper to move along the first direction perpendicular to the plane where the printing screen is located and to change the pressure between the printing scraper and the printing screen.

9. The imprinting apparatus according to claim 8, wherein the scraper driving device is configured to cause the printing scraper to move along a second direction parallel to the lengthwise direction of the printing beam, to further change the pressure between the printing scraper and the printing screen.

10. The imprinting apparatus according to claim 9, wherein the printing scraper assembly is movably mounted on the printing beam, and at least two printing scraper assemblies are combined together to form an integral scraper.

11. The imprinting apparatus according to claim 8, wherein the printing scraper assembly is movably mounted on the printing beam, and at least two printing scraper assemblies are combined together to form an integral scraper.

12. The imprinting apparatus according to claim 7, wherein the printing scraper assembly is movably mounted on the printing beam, and at least two printing scraper assemblies are combined together to form an integral scraper.

\* \* \* \* \*